United States Patent
Qian et al.

(10) Patent No.: US 12,034,079 B2
(45) Date of Patent: Jul. 9, 2024

(54) DOUBLE-GATE TRANSISTOR ARRAY SUBSTRATE AND FABRICATION METHOD OF THE SAME

(71) Applicant: BOE TECHNOLOGY GROUP CO., LTD., Beijing (CN)

(72) Inventors: Yuhan Qian, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 17/765,289

(22) PCT Filed: Apr. 2, 2021

(86) PCT No.: PCT/CN2021/085283
§ 371 (c)(1),
(2) Date: Mar. 30, 2022

(87) PCT Pub. No.: WO2021/218569
PCT Pub. Date: Nov. 4, 2021

(65) Prior Publication Data
US 2022/0367730 A1 Nov. 17, 2022

(30) Foreign Application Priority Data
Apr. 26, 2020 (CN) .......................... 202010338806.7

(51) Int. Cl.
*H01L 29/786* (2006.01)
*G09G 3/20* (2006.01)
*G11C 19/28* (2006.01)
*H01L 27/12* (2006.01)
*H01L 29/66* (2006.01)

(52) U.S. Cl.
CPC ......... *H01L 29/78645* (2013.01); *G09G 3/20* (2013.01); *G11C 19/28* (2013.01);
(Continued)

(58) Field of Classification Search
CPC ................................................ H01L 29/78645
See application file for complete search history.

(56) References Cited

U.S. PATENT DOCUMENTS

| 5,929,464 | A | * | 7/1999 | Yamazaki | .......... H01L 27/1214 257/67 |
| 6,738,109 | B2 | | 5/2004 | Jin | |

(Continued)

FOREIGN PATENT DOCUMENTS

| AU | 2019259412 B2 | 10/2019 |
| AU | 2019259412 A1 | 12/2019 |

(Continued)

OTHER PUBLICATIONS

International Search Report from PCT/CN2021/085283 dated Jul. 7, 2021.
Written Opinion from PCT/CN2021/085283 dated Jul. 7, 2021.

*Primary Examiner* — Sepehr Azari
(74) *Attorney, Agent, or Firm* — Calfee, Halter & Griswold LLP

(57) ABSTRACT

Provided are an array substrate and a fabrication method therefor, a shift register unit, and a display panel. The array substrate includes a first transistor having a double gate structure, and further includes an active layer arranged on one side of the base substrate and a first conductive layer. The active layer includes a first conductor portion connected between a first semiconductor portion and a second semiconductor portion, the first semiconductor portion and a second semiconductor portion forming a channel region of the first transistor. The first conductive layer includes a first conductive portion connected to a stable voltage source, an orthographic projection of the first conductive portion on the base substrate at least partially overlaps with an orthographic projection of the first conductor portion on the base substrate, and the first conducting portion and the first (Continued)

conductor portion form two electrodes of a parallel-plate capacitor.

19 Claims, 7 Drawing Sheets

(52) U.S. Cl.
CPC ........ *H01L 27/1222* (2013.01); *H01L 27/124* (2013.01); *H01L 27/1255* (2013.01); *H01L 27/127* (2013.01); *H01L 29/66757* (2013.01); *H01L 29/78633* (2013.01); *H01L 29/78675* (2013.01); *G09G 2300/0426* (2013.01); *G09G 2310/0286* (2013.01)

(56) References Cited

U.S. PATENT DOCUMENTS

| | | |
|---|---|---|
| 7,092,047 B2 | 8/2006 | Jin |
| 9,373,414 B2 | 6/2016 | Guangliang |
| 9,997,546 B2 | 6/2018 | Xuexin |
| 2003/0016308 A1 | 1/2003 | Jin |
| 2003/0057419 A1* | 3/2003 | Murakami .......... G02F 1/13454 |
| | | 257/E27.111 |
| 2004/0179144 A1 | 9/2004 | Jin |
| 2014/0133621 A1 | 5/2014 | Guangliang |
| 2015/0379923 A1* | 12/2015 | Lee .................... H10K 59/1315 |
| | | 345/82 |
| 2016/0233281 A1* | 8/2016 | Yoon .................... H01L 27/124 |
| 2018/0053795 A1* | 2/2018 | Lan .................... H01L 27/1255 |
| 2018/0151650 A1* | 5/2018 | Ha .................... H01L 29/78645 |
| 2019/0057648 A1* | 2/2019 | Xu ...................... G09G 3/3275 |
| 2020/0294461 A1* | 9/2020 | Xu ...................... G09G 3/3677 |

FOREIGN PATENT DOCUMENTS

| | | |
|---|---|---|
| CN | 1399161 A | 2/2003 |
| CN | 106886111 A | 6/2017 |
| CN | 208141796 U | 11/2018 |
| CN | 111508974 A | 8/2020 |

* cited by examiner

DOUBLE-GATE TRANSISTOR ARRAY SUBSTRATE AND FABRICATION METHOD OF THE SAME

CROSS-REFERENCE TO RELATED APPLICATION

This application is a national phase entry under 35 U.S.C. § 371 of International Application No. PCT/CN2021/085283, filed on Apr. 2, 2021, which claims priority of Chinese Patent Application No. 202010338806.7, filed on Apr. 26, 2020, and entitled "ARRAY SUBSTRATE AND FABRICATION METHOD THEREFOR, SHIFT REGISTER UNIT, AND DISPLAY PANEL", the contents of which are hereby incorporated herein by reference in their entireties as part of this application.

TECHNICAL FIELD

The present disclosure relates to the field of display technology, and in particular to an array substrate and a method for fabricating the array substrate, a shift register unit, and a display panel.

BACKGROUND

In the field of display technology, gate drive circuits are typically used to provide gate drive signals to pixel drive circuits, and consist of a plurality of cascaded shift register units. The shift register unit typically includes a plurality of transistors.

In the related art, some transistors adopt a double-gate structure to avoid transistor leakage, i.e., a transistor includes two channel regions and two gates corresponding to the two channel regions.

However, during the driving process of the gate drive circuit, the voltage of the conductor portion located between the two channel regions will fluctuate under the action of the two gates, resulting in leakage from the conductor portion to the source and drain of the transistor.

It should be noted that the above information disclosed in the background section is intended only to enhance the understanding of the background of the present disclosure, and therefore may include information that does not constitute prior art known to a person of ordinary skill in the art.

SUMMARY

The purpose of the present disclosure is to provide an array substrate, a method for fabricating the array substrate, a shift register unit, and a display panel.

Other features and advantages of the present disclosure will become apparent from the following detailed description, or be learned in part by practice of the present disclosure.

According to an aspect of the present disclosure, there is provided an array substrate, which includes a first transistor in a double-gate structure, and further includes: a base substrate; an active layer, disposed on a side of the base substrate, including a first semiconductor portion, a second semiconductor portion, and a first conductor portion connected between the first semiconductor portion and the second semiconductor portion, where the first semiconductor portion and the second semiconductor portion form a channel region of the first transistor; and a first conductive layer including a first conductive portion connected to a stable voltage source, where an orthographic projection of the first conductive portion on the base substrate at least partially overlaps with an orthographic projection of the first conductor portion on the base substrate, and the first conductive portion and the first conductor portion form two electrodes of a parallel-plate capacitor.

According to an aspect of the present disclosure, there is provided a shift register unit, which includes a first transistor, in a double-gate structure, comprising a first channel region, a second channel region, and a conductor portion disposed between the first channel region and the second channel region, where a first electrode of the first transistor is connected to a signal input terminal, a second electrode of the first transistor is connected to a first node, and a gate of the first transistor is connected to a first clock signal terminal; and a third capacitor connected between the conductor portion and a stable voltage terminal.

According to an aspect of the present disclosure, there is provided a display panel, which includes the array substrate or shift register unit as described above.

It should be understood that the above general description and the following detailed descriptions are exemplary and explanatory only and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. Obviously, the accompanying drawings in the following description show only some embodiments of the present disclosure, and for those of ordinary skill in the art, other drawings may be obtained from these drawings without creative efforts.

DETAILED DESCRIPTION

Figure 1:
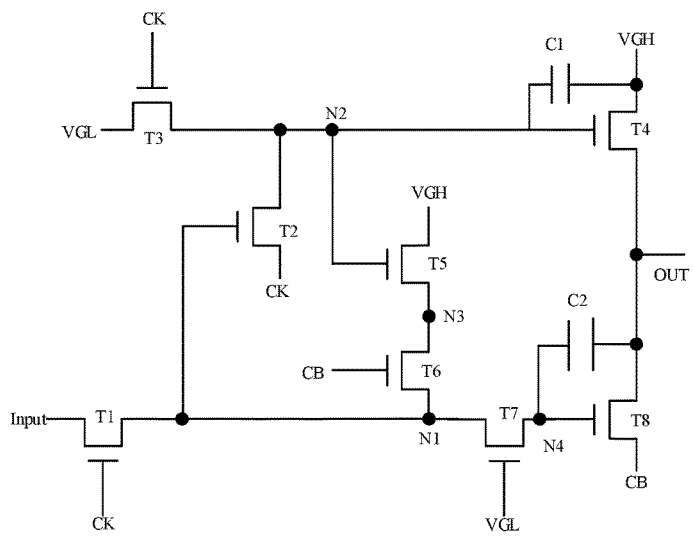
FIG. 1 is a schematic diagram of a circuit of a shift register unit in the related art.

Embodiments will now be described more fully with reference to the accompanying drawings. However, the example embodiments can be implemented in a variety of forms and should not be construed as being limited to the examples set forth herein; rather, these embodiments make the present disclosure more comprehensive and complete and convey the ideas of the example embodiments to those skilled in the art in a comprehensive manner. The same reference numerals in the drawings indicate the same or similar structures, and thus their detailed description will be omitted.

Although relative terms such as "above" and "below" are used in this specification to describe the relative relationship of one component of an icon to another, these terms are used in this specification only for convenience, for example, according to the orientation of the examples shown in the accompanying drawings. It will be appreciated that if the device of the icon is turned upside down, the component described as being "above" will become the component described as being "below". Other relative terms, such as "high," "low," "top," "bottom," "left", "right", etc. have similar meanings. When a structure is "on" other structures, it may mean that a structure is formed on other structures, or that a structure is "directly" set on other structures, or that a structure is "indirectly" set on other structures through another structure.

The terms "a", "one", "the" are used to indicate the existence of one or more elements/components/etc. The terms "include" and "have" are used to indicate an open-ended inclusion and to mean that additional elements/components/etc. may exist in addition to the listed elements/components/etc.

Figure 2:
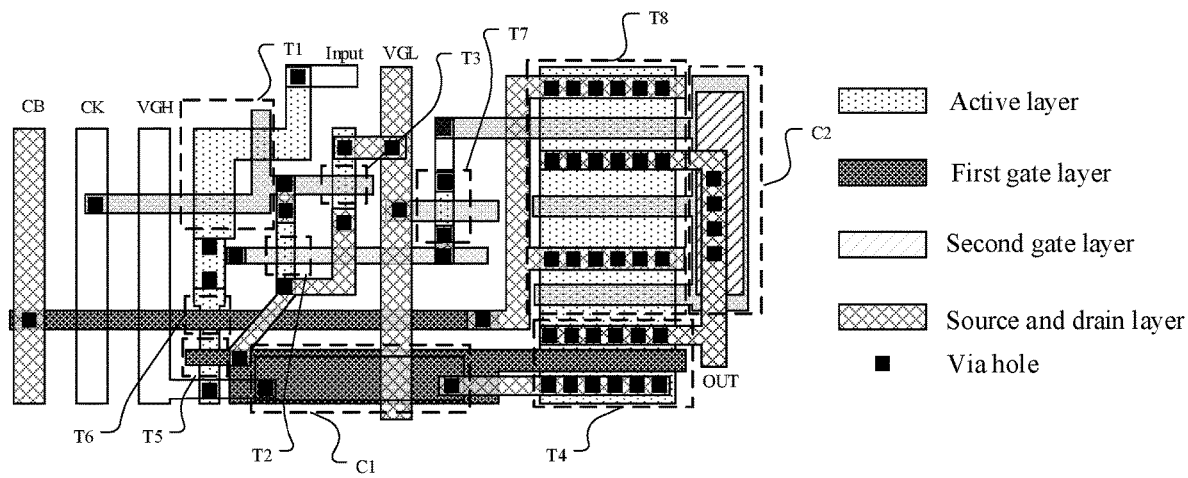
FIG. 2 is a structural schematic diagram of the shift register unit in FIG. 1.

As shown in FIG. 1 and FIG. 2, FIG. 1 is a schematic diagram of a circuit of a shift register unit in the related art, and FIG. 2 is a structural schematic diagram of the shift register unit in FIG. 1. As shown in FIG. 1 and FIG. 2, the shift register unit includes: a first transistor T1, a second transistor T2, a third transistor T3, a fourth transistor T4, a first capacitor C1, a fifth transistor T5, a sixth transistor T6, a seventh transistor T7, an eighth transistor T8, and a second capacitor C2. For the first transistor T1, a first electrode is connected to a signal input terminal Input, a second electrode is connected to a first node N1 and a gate is connected to a first clock signal terminal CK. For the second transistor T2, a first electrode is connected to the first clock signal terminal CK, a second electrode is connected to a second node N2, and a gate is connected to the first node N1. For the third transistor T3, a first electrode is connected to a first power supply terminal VGL, a second electrode is connected to the second node N2, and a gate is connected to the first clock signal terminal CK. For the fourth transistor T4, a first electrode is connected to a second power supply terminal VGH, a second electrode is connected to output terminal OUT, and a gate is connected to the second node N2. The first capacitor C1 is connected between the second node N2 and the second power supply terminal VGH. For the fifth T5, a first electrode is connected to the second power supply terminal VGH, a second electrode is connected to third node N3, and a gate is connected to the second node N2. For the sixth transistor T6, a first electrode is connected to the third node N3, a second electrode is connected to the first node N1, and a gate is connected to a second clock signal terminal CB. For the seventh transistor T7, a first electrode is connected to the first node N1, a second electrode is connected to a fourth node N4, and a gate is connected to the first power supply terminal VGL. For the eighth transistor T8, a first electrode is connected to the output OUT, a second electrode is connected to the second clock signal terminal CB, and a gate is connected to the fourth node N4. The second capacitor C2 is connected between the fourth node N4 and the output OUT.

Figure 3:
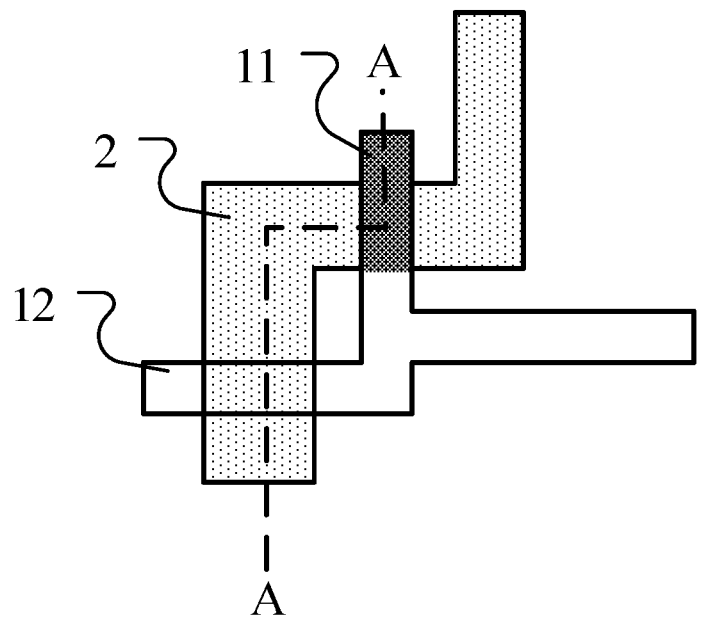
FIG. 3 is a partial enlarged view of the shift register unit in FIG. 2.
Figure 4:
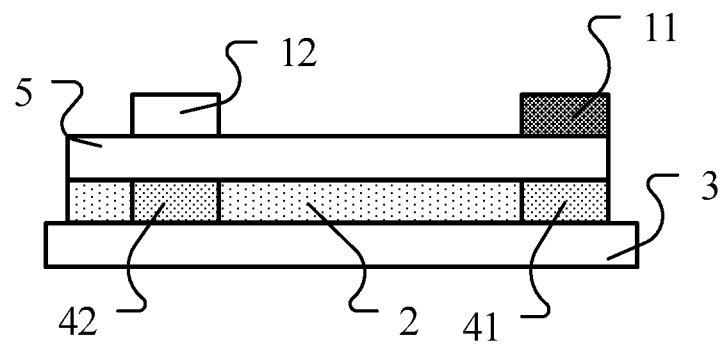
FIG. 4 is a cross-sectional view of the shift register unit of FIG. 3 along a dotted line A-A.
Figure 5:
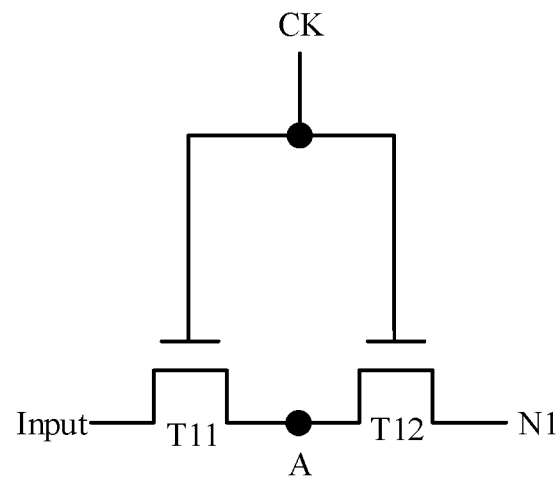
FIG. 5 is an equivalent circuit diagram of a first transistor structure in FIG. 1.

As shown in FIGS. 2, 3 and 4, FIG. 3 is a partial enlarged view of the shift register unit in FIG. 2, and FIG. 4 is a cross-sectional view along a dotted line A-A in FIG. 3. FIG. 3 shows a schematic diagram of a structure at and near the position of the first transistor T1 in FIG. 2. The first transistor T1 is disposed on a base substrate 3, has a double-gate structure, and includes a first gate 11, a second gate 12, a first channel region 41, a second channel region 42, and a conductor portion 2 disposed between the first channel region 41 and the second channel region. A gate insulating layer 5 is provided between the gate layer where the first gate 11 and the second gate 12 are located and the active layer where the first channel region 41 and the second channel region 42 are located. There is a parasitic capacitance between the conductor portion 2 and the first gate 11 and the second gate 12. When the voltage of the first gate 11 and the second gate 12 jumps, the voltage of the conductor portion 2 also jumps. For example, when the voltages of the first gate 11 and the second gate 12 take a positive jump, the voltage of the conductor portion 2 increases, and after the voltages of the first gate 11 and the second gate 12 are restored, the conductor portion 2 will leak electricity to the source and drain of the first transistor T1 under the action of the high voltage, thereby causing abnormal driving of the shift register unit. As shown in FIG. 5, which is an equivalent circuit diagram of the first transistor structure in FIG. 1, the first transistor T1 can be equated into two transistors T11 and T12. Node A represents the equipotential point of the conductor portion 2. When the voltage of the first clock signal terminal CK connected to the gate of the first transistor changes, there will be an electric leakage at node A to the input terminal Input connected to the first electrode of the first transistor and the first node N1 connected to the second electrode of the first transistor.

Figure 6:
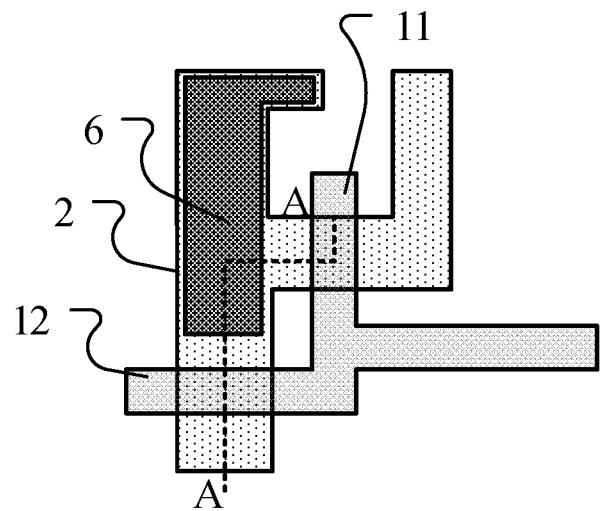
FIG. 6 is a structural schematic diagram of an array substrate in an embodiment of the present disclosure.
Figure 7:
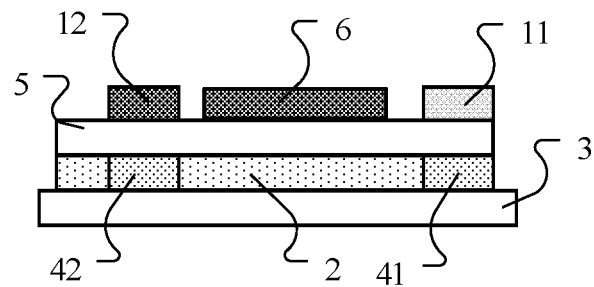
FIG. 7 is a cross-sectional view of the array substrate of FIG. 6 along a dotted line A-A.

Accordingly, the present disclosure provides an array substrate, as shown in FIGS. 6 and 7. FIG. 6 is a structural schematic diagram of an array substrate in an embodiment of the present disclosure, and FIG. 7 is a cross-sectional view along a dotted line A-A in FIG. 6. The array substrate includes a first transistor being a double-gate structure, and further includes a base substrate 3, an active layer, and a first conductive layer. The active layer is disposed on a side of the base substrate 3 and includes a first semiconductor portion 41, a second semiconductor portion 42, and a first conductor portion 2 connected between the first semiconductor portion 41 and the second semiconductor portion 42. The first semiconductor portion 41 and the second semiconductor portion 42 are used to form channel regions of the first transistor. The first conductive layer includes a first conductive portion 6, where an orthographic projection of the first conductive portion 6 on the base substrate at least partially overlaps with an orthographic projection of the first conductor portion 2 on the base substrate, so that the first conductive portion 6 and the first conductor portion 2 form two electrodes of a parallel-plate capacitor, and the first conductive portion 6 is connected to a stable voltage source. The first conductive layer may further include a second conductive portion 11 and a third conductive portion 12 for forming two gates of the first transistor. An orthographic projection of the second conductive portion 11 on the base substrate overlaps with an orthographic projection of the first semiconductor portion 41 on the base substrate. An orthographic projection of the third conductive portion 12 on the base substrate overlaps with an orthographic projection of the second semiconductor portion 42 on the base substrate. A gate insulating layer 5 may be provided between the first conductive layer and the active layer.

In the array substrate, the two electrodes of the parallel-plate capacitor are formed by the first conductive portion 6 and the first conductor portion 2. Therefore, when the voltages of the first gate 11 and the second gate 12 of the first transistor jump, the voltage jump of the first conductor portion 2 is reduced under the effect of the stable voltage of the first conductive portion 6 since the first conductive portion 6 is connected to a stable voltage source and the voltage across the capacitor cannot change abruptly, thereby reducing the leakage current of the first conductor portion 2 to the source and drain of the first transistor when the gate voltage of the first transistor is restored.

Figure 8:
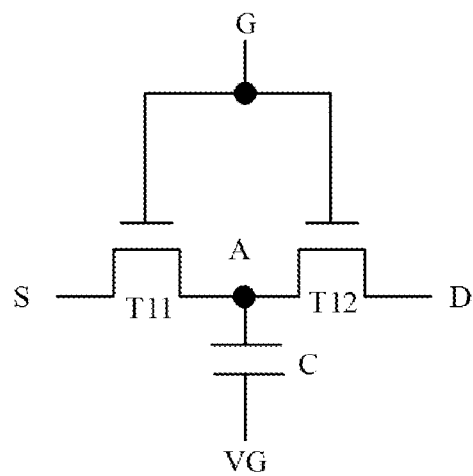
FIG. 8 is an equivalent circuit diagram of a first transistor in FIG. 6.

As shown in FIG. 8, which is an equivalent circuit diagram of the first transistor in FIG. 6, the first transistor can be equated into two transistors T11 and T12. The node A represents the equipotential point of the first conductor portion 2. The capacitor C represents the capacitive structure formed by the first conductive portion 6 and the first conductor portion 2, and is connected between the node A and a stable voltage VG. When the voltage of the gate G of the first transistor changes, the jump voltage of the node A will be reduced under the action of the capacitor C, thereby reducing the leakage current from the node A to the source S and the drain D of the first transistor. In this embodiment, the first transistor may be applied to a shift register unit in an array substrate.

In this embodiment, the first conductive layer may include the second conductive portion 11 and the second conductive portion 12 for forming the two gates of the first transistor, i.e., the first conductive layer is disposed at the gate layer of the array substrate. It should be understood that in other embodiments, the first conductive layer may also be provided at other layers of the array substrate, for example, the first conductive layer may be provided at other conductive layers such as the light-shielding metal layer of the array substrate used to shield the channel regions of the transistor, the source and drain layer of the array substrate, etc.

In this embodiment, the first transistor may be a top-gate structure, as shown in FIG. 7, and the first conductive layer (i.e., the layer where the first conductive portion 6 is located) may be provided on the side, away from the base substrate 3, of the active layer (i.e., the layer where the first semiconductor portion 41 and the second semiconductor portion 42 is located). It should be understood that in other embodiments, the first transistor may be a bottom-gate structure, and the first conductive layer may be provided on the side, facing the base substrate, of the active layer.

Figure 9:
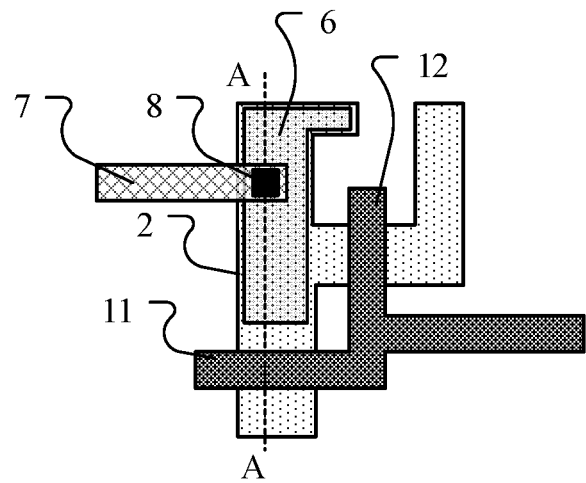
FIG. 9 is a structural schematic diagram of another array substrate in an embodiment of the present disclosure.
Figure 10:
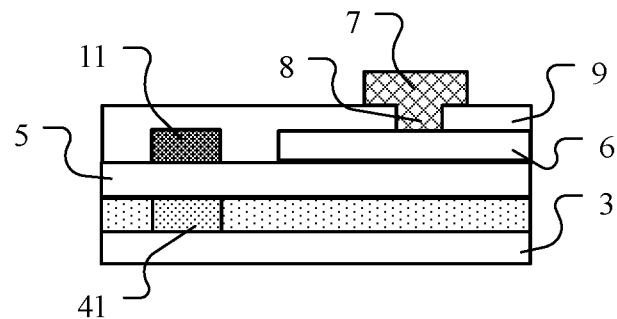
FIG. 10 is a cross-sectional view of the array substrate of FIG. 9 along a dotted line A-A.

In this embodiment, as shown in FIGS. 9 and 10, FIG. 9 is a structural schematic diagram of another array substrate in an embodiment of the present disclosure, and FIG. 10 is a cross-sectional view along a dotted line A-A in FIG. 9. The array substrate may further include a second conductive layer, and the second conductive layer may include a power line 7 used to form the stable voltage source. A gate insulating layer 5 may also be provided on the side, away from the base substrate 3, of the active layer. A dielectric layer 9 may be provided between the first conductive layer and the second conductive layer. As shown in FIGS. 9 and 10, the second conductive layer (i.e., the layer where the power line 7 is located) may be disposed on the side, away from the base substrate 3, of the first conductive layer (i.e., the layer where the first conductive portion 6 is located). Part of the second conductive layer may also be used to form the source and drain of the first transistor, i.e., the second conductive layer is located on a source and drain layer of the array substrate. The power line 7 is electrically connected to the first conductive portion 6 through a via hole 8.

Figure 11:
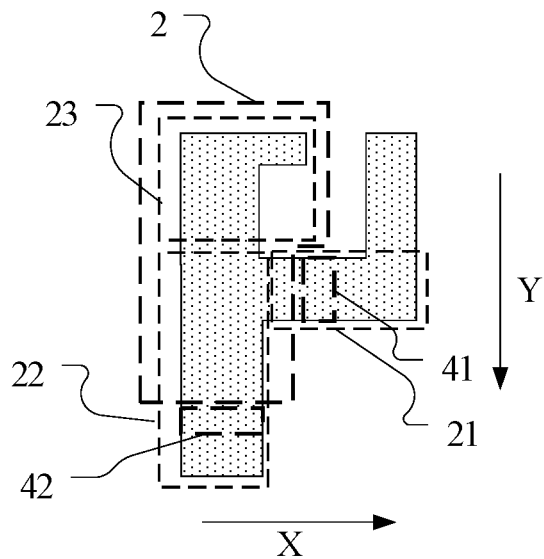
FIG. 11 is a structural schematic diagram of an active layer of the array substrate in FIG. 9.

In this embodiment, as shown in FIG. 11, which is a structural schematic diagram of the active layer of the array substrate in FIG. 9, the active layer may include a first active portion 21, a second active portion 22, and a third active portion 23. The first active portion 21 extends along a first direction X and a part of the first active portion 21 forms the first semiconductor portion 41. The second active portion 22 extends along a second direction Y, a part of the second active portion 22 forms the second semiconductor portion 42, and a beginning end of the second active portion 22 is connected to a beginning end of the first active portion 21. The first direction X intersects the second direction Y, for example, the first direction X may be perpendicular to the second direction Y. The third active portion 23 extends in a direction opposite to the second direction Y, and a beginning end of the third active portion 23 is connected to the beginning end of the second active portion 22. That is, the second active portion 22 and the third active portion 23 form an integral structure intersecting with the first active portion 21. The third active portion 23, part of the first active portion 21, and part of the second active portion 22 form the first conductor portion 2. In this embodiment, the area of the first conductor portion 2 is increased by the third active portion 23. Accordingly, the first conductive portion 6 may also have the same size and shape structure as the first conductor portion 2, and the orthographic projection of the first conductive portion 6 on the base substrate may overlap with the orthographic projection of the first conductor portion 2 on the base substrate. Thus, the first conductor portion 2 and the first conductive portion 6 may form a capacitive structure with a larger capacitance, which in turn improves the suppression effect of the first conductive portion on the voltage jump of the first conductor portion.

Figure 12:
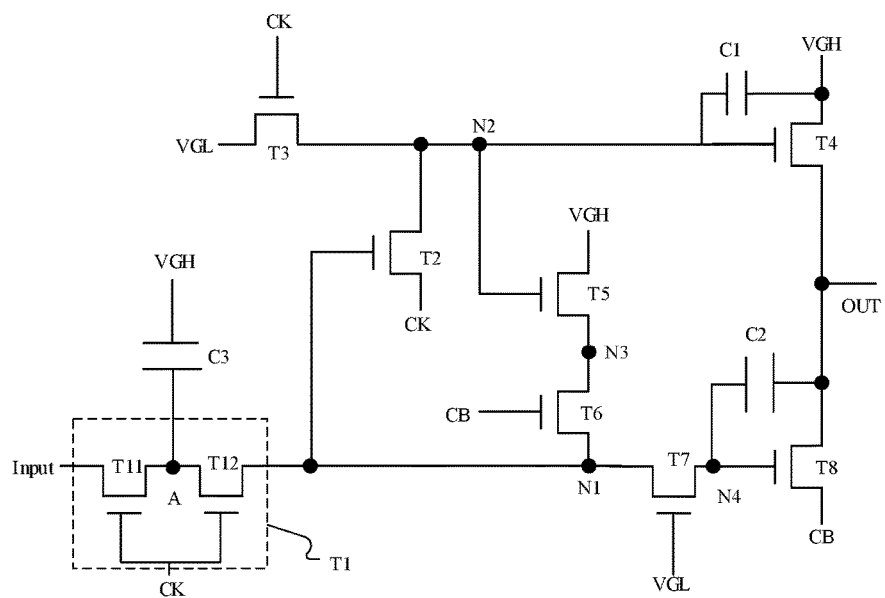
FIG. 12 is a structural schematic diagram of a shift register unit in an embodiment of the present disclosure.

In this embodiment, a shift register unit is also provided, as shown in FIG. 12, which is a structural schematic diagram of the shift register unit in an embodiment of the present disclosure. The shift register unit includes a first transistor T1, a second transistor T2, a third transistor T3, a fourth transistor T4, a first capacitor C1, a fifth transistor T5, a sixth transistor T6, a seventh transistor T7, an eighth transistor T8, and a second capacitor C2. For the first transistor T1, a first electrode is connected to a signal input terminal Input, a second electrode is connected to a first node N1, and a gate is connected to a first clock signal terminal CK. For the second transistor T2, a first electrode is connected to the first clock signal terminal CK, a second electrode is connected to a second node N2, and a gate is connected to the first node N1. For the third transistor T3, a first electrode is connected to a first power supply terminal VGL, a second electrode is connected to the second node N2, and a gate is connected to the first clock signal terminal CK. For the fourth transistor T4, a first electrode is connected to a second power supply terminal VGH, a second electrode is connected to an output terminal OUT, and a gate is connected to the second node N2. The first capacitor C1 is connected between the second node N2 and the second power supply terminal VGH. For the fifth transistor T5, a first electrode is connected to the second power supply terminal VGH, a second electrode is connected to a third node N3, and a gate is connected to the second node N2. For the sixth transistor T6, a first electrode is connected to the third node N3, a second electrode is connected to the first node N1, and a gate is connected to a second clock signal terminal CB. For the seventh transistor T7, a first electrode is connected to the first node N1, a second electrode is connected to a fourth node N4, and a gate is connected to the first power supply terminal VGL. For the eighth transistor T8, a first electrode is connected to the output terminal OUT, a second electrode is connected to the second clock signal terminal CB, and a gate is connected to the fourth node N4. The second capacitor C2 is connected between the fourth node N4 and the output terminal OUT. The first transistor T1 is a transistor with a double-gate structure, and includes a first channel region, a second channel region and a conductor portion disposed between the first channel region and the second channel region. The first transistor T1 may be equivalent to transistor T11 and transistor T12. Node A is an equipotential point of the conductor portion. The shift register unit may further include a third capacitor C3, which is connected between node A and the second power supply terminal VGH.

Figure 13:
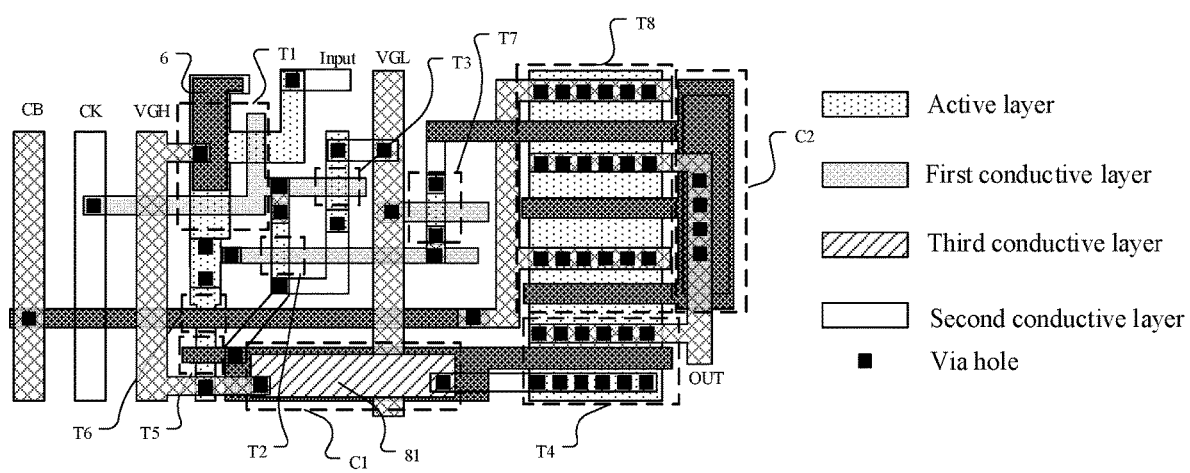
FIG. 13 is a structural schematic diagram of yet another array substrate in an embodiment of the present disclosure.

In this embodiment, as shown in FIG. 13, which is a structural schematic diagram of yet another array substrate in an embodiment of the present disclosure, the array substrate may be integrated with the shift register unit as described above. A first power line VGL is used to provide a power signal to the first power supply terminal, a second power line VGH is used to provide a power signal to the second power supply terminal, a first clock signal line CK is used to provide a clock signal to the first clock signal terminal, and a second clock signal line CB is used to provide a clock signal to the second clock signal terminal. For the first transistor T1, a first electrode is connected to a signal input terminal Input, a second electrode is connected to a first node, and a gate is connected to the first clock signal line CK. For the second transistor T2, a first electrode is connected to the first clock signal line CK, a second electrode is connected to a second node, and a gate is connected to the first node. For the third transistor T3, a first electrode is connected to the first power line VGL, a second electrode is connected to the second node, and a gate is connected to the first clock signal line CK. For the fourth transistor T4, a first electrode is connected to the second power line VGH, a second electrode is connected to an output terminal, and a gate is connected to a second node. The first capacitor C1 is connected between the second node and the second power line VGH. For the fifth transistor T5, a first electrode is connected to the second power line VGH, a second electrode is connected to a third node, and a gate is connected to the second node. For the sixth transistor T6, a first electrode is connected to the third node, a second electrode is connected to the first node, and a gate is connected to the second clock signal line CB. For the seventh transistor T7, a first electrode is connected to the first node, a second electrode is connected to a fourth node, and a gate is connected to the first power line VGL. For the eighth transistor T8, a first electrode is connected to the output terminal, a second electrode is connected to the second clock signal line CB, and a gate is connected to the fourth node. The second capacitor C2 is connected between the fourth node and the output terminal. The third capacitor C3 is connected between node A and the second power supply terminal VGH.

As shown in FIG. 13, the array substrate may include an active layer, a first conductive layer, a second conductive layer, and a third conductive layer. The active layer, the first conductive layer, the third conductive layer, and the second conductive layer may be sequentially laminated on the base substrate.

Figure 14:
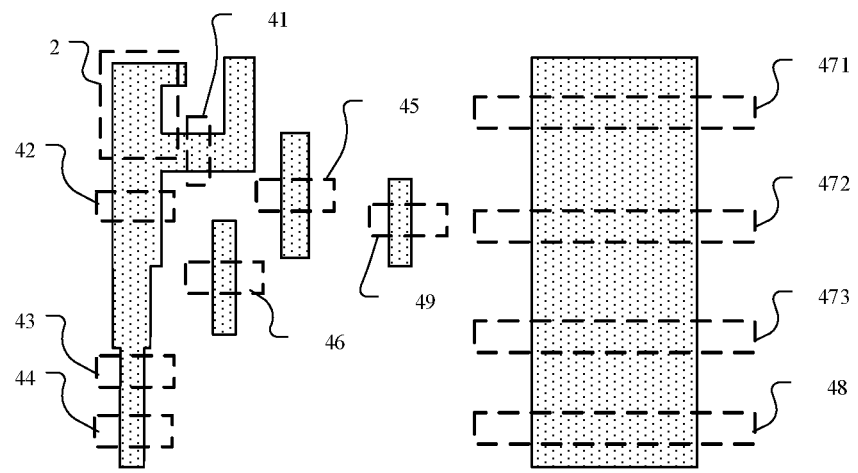
FIG. 14 is a structural schematic diagram of an active layer of the array substrate of the present disclosure.

As shown in FIG. 14, which is a structural schematic diagram of the active layer of the array substrate of the present disclosure, the active layer may include a first semiconductor portion 41, a second semiconductor portion 42, a first conductor portion 2 connected between the first semiconductor portion 41 and the second semiconductor portion 42, a third semiconductor portion 43, a fourth semiconductor portion 44, a fifth semiconductor portion 45, a sixth semiconductor portion 46, seventh semiconductor portions 471, 472 and 473, an eighth semiconductor portion 48, and a ninth semiconductor portion 49. The first semiconductor portion 41 and the second semiconductor portion 42 are used to form the channel regions of the first transistor. The third semiconductor portion 43 is used to form the channel region of the sixth transistor. The fourth semiconductor portion 44 is used to form the channel region of the fifth transistor. The fifth semiconductor portion 45 is used to form the channel region of the third transistor. The sixth semiconductor section 46 is used to form the channel region of the second transistor. The seventh semiconductor portions 471, 472 and 473 are used to form the channel regions of the eighth transistor. The eighth semiconductor portion 48 is used to form the channel region of the fourth transistor. The ninth semiconductor portion 49 is used to form the channel region of the seventh transistor. The first conductor portion 2 is used to form a first electrode of the third capacitor. The active layer may be a polysilicon layer, and some of the above-mentioned semiconductor portions may be formed by lightly doping the polysilicon layer, which may reduce the threshold voltage of the corresponding transistor. The amount of light doping of the semiconductor portions may be $10^{12}$ ions/cm$^2$. The other parts of the polysilicon layer except the above-mentioned semiconductor portions may form a conductive layer by heavy doping, and the amount of heavy doping may range from $10^{14}$ ions/cm$^2$ to $10^{16}$ ions/cm$^2$. It should be understood that in other embodiments, the active layer may also be made of other semiconductor materials, for example, the active layer may be made of indium gallium zinc oxide semiconductor material, and the parts of the active layer other than the above-mentioned semiconductor portions may form conductive portions by hydrogen ion injection.

Figure 15:
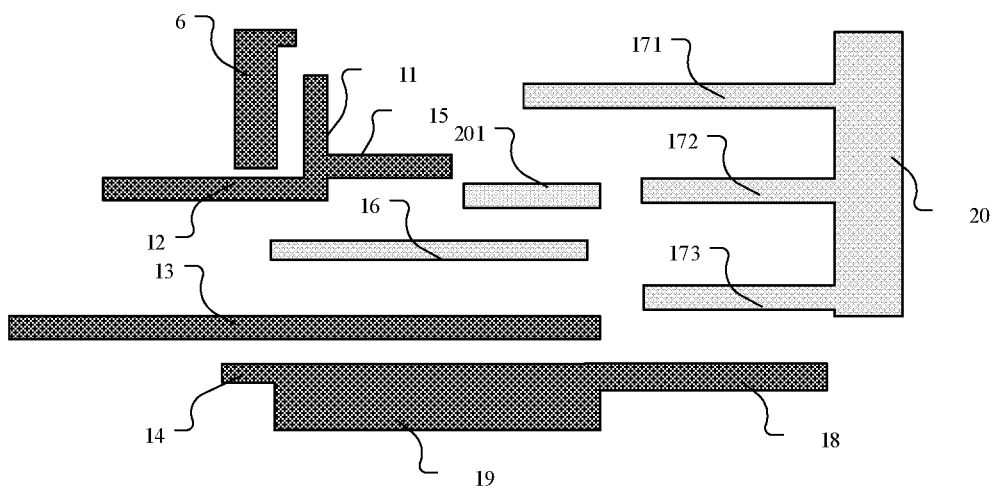
FIG. 15 is a structural schematic diagram of a first conductive layer of the array substrate of the present disclosure.

As shown in FIG. 15, which is a structural schematic diagram of a first conductive layer of the array substrate of the present disclosure, the first conductive layer may include a first conductive portion 6, a second conductive portion 11, a third conductive portion 12, a fourth conductive portion 13, a fifth conductive portion 14, a sixth conductive portion 15, a seventh conductive portion 16, eighth conductive portions 171, 172 and 173, a ninth conductive portion 18, a tenth conductive portion 19, an eleventh conductive portion 20, and a twenty-second conductive portion 201. The first conductive portion 6 is used to form a second electrode of the third capacitor C3. The second conductive portion 11 and the third conductive portion 12 are used to form the gates of the first transistor. The fourth conductive portion 13 is used to form the gate of the sixth transistor. The fifth conductive portion 14 is used to form the gate of the fifth transistor. The sixth conductive portion 15 is used to form the gate of the third transistor. The seventh conductive portion 16 is used to form the gate of the second transistor. The eighth conductive portions 171, 172 and 173 are used to form the gate of the eighth transistor. The ninth conductive portion 18 is used to form the gate of the fourth transistor. The tenth conductive portion 19 is used to form a first electrode of the first capacitor C1. The eleventh conductive portion 20 is used to form a first electrode of the second capacitor C2. The twenty-second conductive portion 201 is used to form the gate of the seventh transistor.

Figure 16:
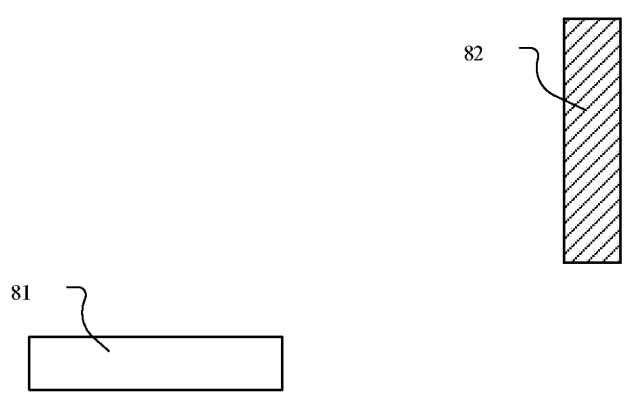
FIG. 16 is a structural schematic diagram of a third conductive layer of the array substrate of the present disclosure.

As shown in FIG. 16, which is a structural schematic diagram of a third conductive layer of the array substrate of the present disclosure, the third conductive layer includes a first electrode portion 81 and a second electrode portion 82. The first electrode portion 81 is used to form a second electrode of the first capacitor C1, and the second electrode portion 82 is used to form a second electrode of the second capacitor C2.

Figure 17:
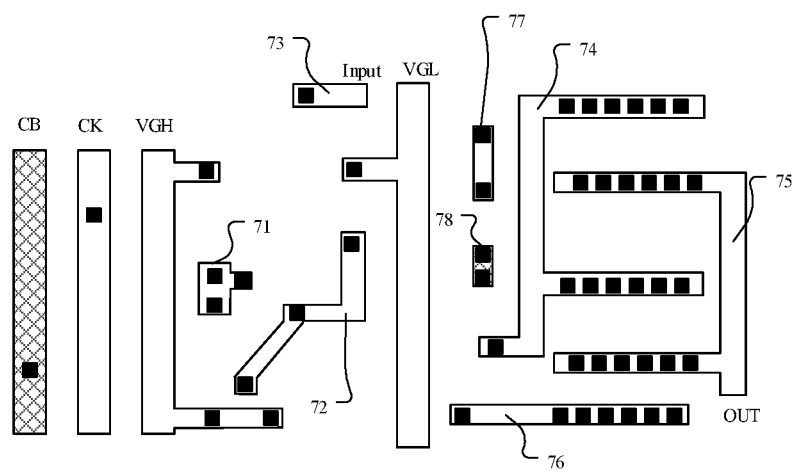
FIG. 17 is a structural schematic diagram of a second conductive layer of the array substrate of the present disclosure.

As shown in FIG. 17, which is a structural schematic diagram of the second conductive layer of the array substrate of the present disclosure, the second conductive layer includes a first clock signal line CK, a second clock signal line CB, a first power line VGL, a second power line VGH, a first connection electrode 71, a second connection electrode 72, a third connection electrode 73, a fourth connection electrode 74, a fifth connection electrode 75, a sixth connection electrode 76, a seventh connection electrode 77, and an eighth connection electrode 78. The first clock signal line CK is electrically connected to the second conductive portion 11 through the via hole, so that the first clock signal line is connected to the gate of the first transistor. The second power line VGH is electrically connected to the first conductive portion 6 through the via hole, so that the second power line is connected to one electrode of the third capacitor, while the second power line VGH is electrically connected to the first electrode portion 81 through the via hole, so that one electrode of the first capacitor is connected to the second power line, and the second power line VGH is electrically connected to the conductor portion on the side, away from the third semiconductor section 43, of the fourth semiconductor portion 44 through the via hole, so that the second power line VGH connects to the first electrode of the fifth transistor. The second clock signal line CB is electrically connected to the fourth conductive portion 13 through the via hole, so that the second clock signal line connects to the gate of the sixth transistor. The first power line VGL is electrically connected to the conductor portion on one side of the fifth semiconductor portion 45 through the via hole, so that the first power line is connected to the first electrode of the third transistor. The first connection electrode 71 is connected to the seventh conductive portion 16 and the conductor portion between the second semiconductor portion 42 and the third semiconductor portion 43 through the via hole, so that the second electrode of the first transistor, the second electrode of the sixth transistor, and the gate of the second transistor are connected to each other. The second connection electrode 72 is electrically connected to the fifth conductive portion 14, the conductor portion on one side of the sixth semiconductor portion 46, and the conductor portion on one side of the fifth semiconductor portion through the via hole, so that the gate of the fifth transistor, the second electrode of the second transistor, and the second electrode of the third transistor are connected to each other. The third connection electrode 73 forms a signal input terminal Input and is electrically connected to the conductor portion on one side of the first semiconductor portion 41 through the via hole. The fourth connection electrode 74 is electrically connected to the fourth conductive portion 13, the conductor portion on one side of the seventh semiconductor portion 471 away from the seventh semiconductor portion 472, and the conductor portion between the seventh semiconductor portion 472 and the seventh semiconductor portion 473, so that the second clock signal terminal is connected to the first electrode of the eighth transistor. The fifth connection electrode 75 forms an output terminal OUT connected to the second electrode of the eighth transistor, and is electrically connected to the conductor portion between the seventh semiconductor portion 471 and the seventh semiconductor portion 472 and the conductor portion between the seventh semiconductor portion 473 and the eighth semiconductor portion 48 through via holes, respectively, so that the output terminal OUT is connected to the second electrode of the eighth transistor and the second electrode of the fourth transistor, while the fifth connection electrode 75 is electrically connected to the second electrode portion 82 through the via hole so that one electrode of the second capacitor is connected to the output terminal OUT. The sixth connection electrode 76 is electrically connected to the first electrode portion 81 and the conductor portion on the side of the eighth semiconductor portion 48 away from the seventh semiconductor section 473 through the via hole, so that the first electrode of the fourth transistor is connected to the second power line. The seventh connection electrode 77 is electrically connected to the eighth conductor portion 171 and the conductor portion on one side of the ninth semiconductor portion 49 through the via hole, so that the second electrode of the seventh transistor is connected to the gate of the eighth transistor. The eighth connection electrode 78 is electrically connected to the conductor portion on the other side of the ninth semiconductor portion and the seventh conductive portion 16 through the via hole, so that the gate of the second transistor is connected to the first electrode of the seventh transistor.

It should be understood that in this embodiment, one electrode of the third capacitor is connected to the second power line VGH, and in other embodiments, the one electrode of the third capacitor may be connected to other stable voltage sources such as the first power line VGL.

Figure 18:
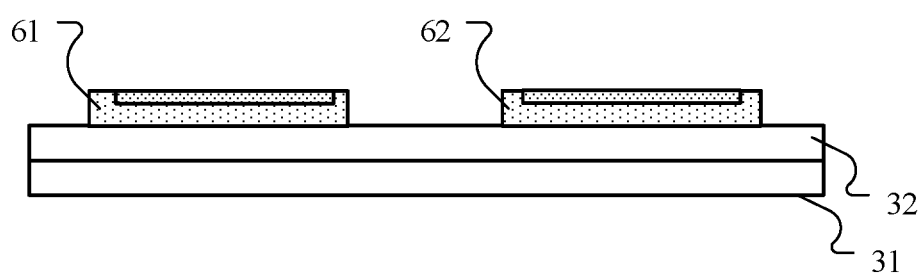
FIG. 18 is a structural schematic diagram of an array substrate during a fabrication process in an embodiment of the present disclosure.
Figure 19:
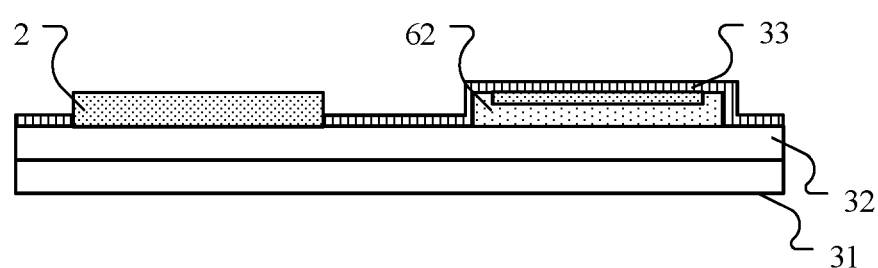
FIG. 19 is a structural schematic diagram of an array substrate during a fabrication process in an embodiment of the present disclosure.
Figure 20:
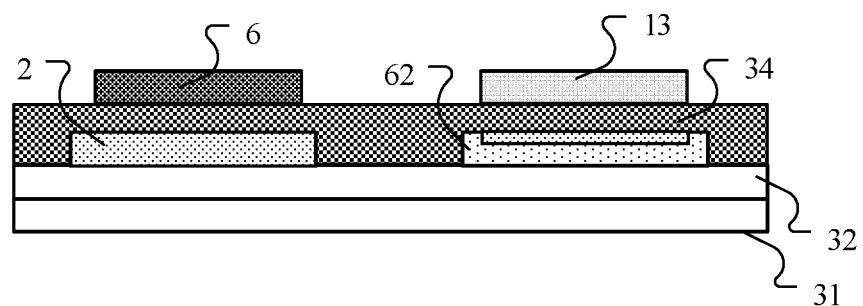
FIG. 20 is a structural schematic diagram of an array substrate during a fabrication process in an embodiment of the present disclosure.

In this embodiment, in the process of forming the above array substrate, the active layer needs to be doped to different degrees. As shown in FIGS. 18 to 20, this embodiment only illustrates the structural schematic diagrams of the third capacitor C3 and the sixth transistor during the fabrication process.

As shown in FIG. 18, a base substrate 31 is first provided, a buffer layer 32 is formed on the base substrate 31, a polysilicon layer is formed on one side of the buffer layer 32 away from the base substrate, and the polysilicon layer is patterned to obtain a semiconductor portion 61 and a semiconductor portion 62, and then the semiconductor portions 61 and 62 are lightly doped. The light doping amount may be $10^{12}$ ions/cm$^2$. The doped semiconductor portion 62 can form the channel region of the sixth transistor.

As shown in FIG. 19, a shielding material layer is formed on one side of the active layer away from the base substrate 31, and the shielding material layer is patterned to form a shielding layer 33 to leak out the semiconductor portion 61, and then the semiconductor portion 61 is heavily doped to form a first conductor portion 2. The heavy doping amount may range from $10^{14}$ ions/cm$^2$ to $10^{16}$ ions/cm$^2$. The first conductor portion 2 is used to form an electrode of the third capacitor.

As shown in FIG. 20, the shielding layer 33 is peeled off, a gate insulating layer 34 is formed on one side of the source layer away from the base substrate 31, and a gate layer is formed on one side of the gate insulating layer away from the base substrate. The gate layer includes a first conductive portion 6 and a fourth conductive portion 13. The first conductive portion 6 is used to form the other electrode of the third capacitor, and the fourth conductive portion 13 is used to form the gate of the sixth transistor.

The present disclosure also provides a display panel that includes an array substrate or a shift register unit as described above.

It should be understood that the present disclosure is not limited to the precise construction already described above and illustrated in the accompanying drawings, and that various modifications and changes may be made without departing from its scope. The scope of the present disclosure is limited only by the appended claims.

What is claimed is:

1. An array substrate, comprising a first transistor in a double-gate structure, and further comprising:
   a base substrate;
   an active layer, disposed on a side of the base substrate, comprising a first semiconductor portion, a second semiconductor portion, and a first conductor portion connected between the first semiconductor portion and the second semiconductor portion, wherein the first semiconductor portion and the second semiconductor portion form a channel region of the first transistor; and
   a first conductive layer comprising a first conductive portion connected to a stable voltage source, wherein an orthographic projection of the first conductive portion on the base substrate at least partially overlaps with an orthographic projection of the first conductor portion on the base substrate, and the first conductive portion and the first conductor portion form two electrodes of a parallel-plate capacitor;
   wherein the active layer comprises:
   a first active portion extending in a first direction, wherein a part of the first active portion forms the first semiconductor portion;
   a second active portion extending in a second direction intersecting with the first direction, wherein a part of the second active portion forms the second semiconductor portion, and a beginning end of the second active portion is connected to a beginning end of the first active portion; and
   a third active portion extending in a direction opposite to the second direction, wherein a beginning end of the third active portion is connected to the beginning end of the second active portion;
   wherein the third active portion, part of the first active portion, and part of the second active portion form the first conductor portion;
   wherein the active layer further comprises a third semiconductor portion and a fourth semiconductor portion;
   wherein the first semiconductor portion, the second semiconductor portion, the third semiconductor portion, the fourth semiconductor portion, and the first conductor portion are formed as a one-piece structure having an opening in the active layer; and
   wherein the opening faces in a direction opposite to the second direction and away from the second semiconductor portion.

2. The array substrate of claim 1, wherein:
   the first conductive layer further comprises a second conductive portion and a third conductive portion, and the second conductive portion and the third conductive portion form the two gates of the first transistor;
   an orthographic projection of the second conductive portion on the base substrate overlaps with an orthographic projection of the first semiconductor portion on the base substrate; and
   an orthographic projection of the third conductive portion on the base substrate overlaps with an orthographic projection of the second semiconductor portion on the base substrate.

3. The array substrate of claim 1, wherein the first conductive layer is disposed on a side, away from the base substrate, of the active layer.

4. The array substrate of claim 3, further comprising:
   a second conductive layer comprising a power line for forming the stable voltage source.

5. The array substrate of claim 4, wherein the second conductive layer is disposed on a side, away from the base substrate, of the first conductive layer, and a part of the second conductive layer forms source and drain portions of the first transistor; and
   the power line is electrically connected to the first conductive portion through a via hole.

6. The array substrate of claim 4, wherein a first electrode of the first transistor is connected to a signal input terminal, a second electrode of the first transistor is connected to a first node, and the two gates are connected to a first clock signal line, and the array substrate further comprises:
   a second transistor with a first electrode connected to the first clock signal line, a second electrode connected to a second node, and a gate connected to the first node;
   a third transistor with a first electrode connected to a first power line, a second electrode connected to the second node, and a gate connected to the first clock signal line;
   a fourth transistor with a first electrode connected to a second power line, a second electrode connected to an output terminal, and a gate connected to the second node;
   a first capacitor connected between the second node and the second power line;
   a fifth transistor with a first electrode connected to the second power line, a second electrode connected to a third node, and a gate connected to the second node;
   a sixth transistor with a first electrode connected to the third node, a second electrode connected to the first node, and a gate connected to a second clock signal line;
   a seventh transistor with a first electrode connected to the first node, a second electrode connected to a fourth node, and a gate connected to the first power line;
   an eighth transistor with a first electrode connected to the output terminal, a second electrode connected to the second clock signal line, and a gate connected to the fourth node; and
   a second capacitor connected between the fourth node and the output terminal.

7. The array substrate of claim 6, wherein:
   the power line is formed by the first power line, or
   the power line is formed by the second power line.

8. The array substrate of claim 6, wherein the active layer is a polysilicon layer, and each channel region, of one or more transistors among the first to eighth transistors, is formed by lightly doping the polysilicon layer.

9. The array substrate of claim 1, comprising a shift register unit comprising:
the first transistor comprising a first channel region, a second channel region, and the conductor portion disposed between the first channel region and the second channel region, wherein
a first electrode of the first transistor is connected to a signal input terminal,
a second electrode of the first transistor is connected to a first node, and
a gate of the first transistor is connected to a first clock signal terminal; and
a third capacitor connected between the conductor portion and a stable voltage terminal.

10. The array substrate of claim 9, wherein the shift register unit further comprises:
a second transistor with a first electrode connected to the first clock signal terminal, a second electrode connected to a second node, and a gate connected to the first node;
a third transistor with a first electrode connected to a first power supply terminal, a second electrode connected to the second node, and a gate connected to the first clock signal terminal;
a fourth transistor with a first electrode connected to a second power supply terminal, a second electrode connected to an output terminal, and a gate connected to the second node;
a first capacitor connected between the second node and the second power supply terminal;
a fifth transistor with a first electrode connected to the second power supply terminal, a second electrode connected to a third node, and a gate connected to the second node;
a sixth transistor with a first electrode connected to the third node, a second electrode connected to the first node, and a gate connected to a second clock signal terminal;
a seventh transistor with a first electrode connected to the first node, a second electrode connected to a fourth node, and a gate connected to the first power supply terminal;
an eighth transistor with a first electrode connected to the output terminal, a second electrode connected to the second clock signal terminal, and a gate connected to the fourth node; and
a second capacitor connected between the fourth node and the output terminal.

11. The shift register unit of claim 10, wherein:
the stable voltage terminal is formed by the first power supply terminal, or
the stable voltage terminal is formed by the second power supply terminal.

12. A display panel, comprising the shift register unit of claim 9.

13. The display panel of claim 12, further comprising:
a second transistor with a first electrode connected to the first clock signal terminal, a second electrode connected to a second node, and a gate connected to the first node;
a third transistor with a first electrode connected to a first power supply terminal, a second electrode connected to the second node, and a gate connected to the first clock signal terminal;
a fourth transistor with a first electrode connected to a second power supply terminal, a second electrode connected to an output terminal, and a gate connected to the second node;
a first capacitor connected between the second node and the second power supply terminal;
a fifth transistor with a first electrode connected to the second power supply terminal, a second electrode connected to a third node, and a gate connected to the second node;
a sixth transistor with a first electrode connected to the third node, a second electrode connected to the first node, and a gate connected to a second clock signal terminal;
a seventh transistor with a first electrode connected to the first node, a second electrode connected to a fourth node, and a gate connected to the first power supply terminal;
an eighth transistor with a first electrode connected to the output terminal, a second electrode connected to the second clock signal terminal, and a gate connected to the fourth node; and
a second capacitor connected between the fourth node and the output terminal.

14. The display panel of claim 13, further comprising:
the stable voltage terminal is formed by the first power supply terminal, or
the stable voltage terminal is formed by the second power supply terminal.

15. A display panel, comprising the array substrate of claim 1, wherein the array substrate comprises a first transistor in a double-gate structure, and further comprises:
a base substrate;
an active layer, disposed on a side of the base substrate, comprising a first semiconductor portion, a second semiconductor portion, and a first conductor portion connected between the first semiconductor portion and the second semiconductor portion, wherein the first semiconductor portion and the second semiconductor portion form a channel region of the first transistor; and
a first conductive layer comprising a first conductive portion connected to a stable voltage source, wherein an orthographic projection of the first conductive portion on the base substrate at least partially overlaps with an orthographic projection of the first conductor portion on the base substrate, and the first conductive portion and the first conductor portion form two electrodes of a parallel-plate capacitor;
wherein the active layer comprises:
a first active portion extending in a first direction, wherein a part of the first active portion forms the first semiconductor portion;
a second active portion extending in a second direction intersecting with the first direction, wherein a part of the second active portion forms the second semiconductor portion, and a beginning end of the second active portion is connected to a beginning end of the first active portion; and
a third active portion extending in a direction opposite to the second direction, wherein a beginning end of the third active portion is connected to the beginning end of the second active portion;
wherein the third active portion, part of the first active portion, and part of the second active portion form the first conductor portion;
wherein the active layer further comprises a third semiconductor portion and a fourth semiconductor portion;

wherein the first semiconductor portion, the second semiconductor portion, the third semiconductor portion, the fourth semiconductor portion, and the first conductor portion are formed as a one-piece structure having an opening in the active layer; and wherein the opening faces in a direction opposite to the second direction and away from the second semiconductor portion.

16. The display panel of claim 15, wherein:

the first conductive layer further comprises a second conductive portion and a third conductive portion, and the second conductive portion and the third conductive portion form the two gates of the first transistor;

an orthographic projection of the second conductive portion on the base substrate overlaps with an orthographic projection of the first semiconductor portion on the base substrate; and an orthographic projection of the third conductive portion on the base substrate overlaps with an orthographic projection of the second semiconductor portion on the base substrate.

17. A method for fabricating an array substrate, wherein the array substrate comprises a first transistor in a double-gate structure, and the method comprises:

forming a base substrate;

forming an active layer on one side of the base substrate, wherein the active layer comprises a first semiconductor portion, a second semiconductor portion, and a first conductor portion connected between the first semiconductor portion and the second semiconductor portion, and the first semiconductor portion and the second semiconductor portion form a channel region of the first transistor;

forming a first conductive layer, wherein the first conductive layer comprises a first conductive portion;

an orthographic projection of the first conductive portion on the base substrate at least partially overlaps with an orthographic projection of the first conductor portion on the base substrate; and the first conductive portion and the first conductor portion form two electrodes of a parallel-plate capacitor; and connecting the first conductive portion to a stable voltage source;

wherein the active layer comprises:

a first active portion extending in a first direction, wherein a part of the first active portion forms the first semiconductor portion;

a second active portion extending in a second direction intersecting with the first direction, wherein a part of the second active portion forms the second semiconductor portion, and a beginning end of the second active portion is connected to a beginning end of the first active portion; and a third active portion extending in a direction opposite to the second direction, wherein a beginning end of the third active portion is connected to the beginning end of the second active portion;

wherein the third active portion, part of the first active portion, and part of the second active portion form the first conductor portion;

wherein the active layer further comprises a third semiconductor portion and a fourth semiconductor portion;

wherein the first semiconductor portion, the second semiconductor portion, the third semiconductor portion, the fourth semiconductor portion, and the first conductor portion are formed as a one-piece structure having an opening in the active layer; and wherein the opening faces in a direction opposite to the second direction and away from the second semiconductor portion.

18. The method for fabricating the array substrate of claim 17, further comprising:

forming a gate insulating layer on one side, away from the base substrate, of the active layer; and forming the first conductive layer comprising:

forming the first conductive layer on one side, away from the base substrate, of the gate insulating layer.

19. The method for fabricating the array substrate of claim 17, wherein forming the active layer on one side of the base substrate comprises:

forming a polysilicon material layer on the side of the base substrate;

forming a polysilicon layer by patterning the polysilicon material layer, wherein the polysilicon layer comprising a first polysilicon portion;

lightly doping the polysilicon layer;

forming a shielding layer on one side, away from the base substrate, of the polysilicon layer, and exposing the first polysilicon portion outside the shielding layer; and forming the first conductor portion from the first polysilicon portion by heavily doping the first polysilicon portion.

* * * * *